(12) United States Patent
Aoto et al.

(10) Patent No.: US 8,343,372 B2
(45) Date of Patent: Jan. 1, 2013

(54) SURFACE PROCESSING METHOD FOR MOUNTING STAGE

(75) Inventors: Tadashi Aoto, Miyagi-gun (JP); Eiichiro Kikuchi, Nirasaki (JP); Masakazu Higuma, Nirasaki (JP); Kimihiro Higuchi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 1000 days.

(21) Appl. No.: 12/057,975

(22) Filed: Mar. 28, 2008

(65) Prior Publication Data

US 2008/0237030 A1    Oct. 2, 2008

Related U.S. Application Data

(60) Provisional application No. 60/954,158, filed on Aug. 6, 2007.

(30) Foreign Application Priority Data

Mar. 30, 2007    (JP) ................................. 2007-092378

(51) Int. Cl.
*B29C 61/04*    (2006.01)
*H05H 1/00*    (2006.01)
(52) U.S. Cl. .......................................... 216/67; 204/164
(58) Field of Classification Search ........................ None
See application file for complete search history.

(56) References Cited

U.S. PATENT DOCUMENTS

| | | | | |
|---|---|---|---|---|
| 5,675,471 A * | 10/1997 | Kotecki | .......................... | 361/234 |
| 6,106,625 A * | 8/2000 | Koai et al. | ...................... | 118/715 |
| 6,636,413 B2 * | 10/2003 | Tsuruta | .......................... | 361/234 |
| 7,341,673 B2 * | 3/2008 | Magni | .............................. | 216/59 |
| 7,655,933 B2 * | 2/2010 | England et al. | ........... | 250/492.21 |
| 7,843,632 B2 * | 11/2010 | Bowering | ...................... | 359/359 |
| 2002/0001928 A1 * | 1/2002 | Wang et al. | .................... | 438/582 |
| 2002/0109954 A1 * | 8/2002 | Tsuruta | .......................... | 361/234 |
| 2005/0037617 A1 * | 2/2005 | Magni | ............................ | 438/689 |
| 2008/0042078 A1 * | 2/2008 | England et al. | ........... | 250/492.21 |
| 2008/0044257 A1 * | 2/2008 | England et al. | ............. | 414/217.1 |
| 2009/0025876 A1 * | 1/2009 | Magni | ...................... | 156/345.27 |
| 2009/0123140 A1 | 5/2009 | Komatsu | | |

FOREIGN PATENT DOCUMENTS

| | | |
|---|---|---|
| JP | 2001-127041 | 5/2001 |
| JP | 2007-258240 | 10/2007 |
| KR | 10-2005-0054950 | 6/2005 |
| WO | WO 2004/027839 A2 | 4/2004 |
| WO | WO 2007/007744 A1 | 1/2007 |

* cited by examiner

*Primary Examiner* — Allan Olsen
(74) *Attorney, Agent, or Firm* — Oblon, Spivak, McClelland, Maier & Neustadt, L.L.P.

(57) ABSTRACT

A surface processing method for a mounting stage, which enables a mounting surface conforming to a substrate to be formed while saving time and effort. The substrate is mounted on a mounting surface of the mounting stage disposed in a housing chamber of a substrate processing apparatus that carries out plasma processing on the substrate. The mounted substrate is thermally expanded.

8 Claims, 4 Drawing Sheets

SURFACE PROCESSING METHOD FOR MOUNTING STAGE

BACKGROUND OF THE INVENTION

1. Field of the Invention

The present invention relates to a surface processing method for a mounting stage on which a substrate is mounted, and in particular to a surface processing method for a mounting stage of a substrate processing apparatus that carries out processing on substrates by plasma.

2. Description of the Related Art

Substrate processing apparatuses that carry out plasma processing on wafers as substrates have a housing chamber in which a wafer is housed, and a mounting stage that is disposed in the housing chamber and on which the wafer is mounted. In such substrate processing apparatuses, plasma is produced in the housing chamber, and the wafer is subjected to the plasma processing by the plasma.

The mounting stage is made of aluminum, and a thermally sprayed film made of a ceramic such as alumina is formed on an upper surface of the mounting stage. An electrostatic electrode plate to which a DC voltage is applied is buried in the thermally sprayed film.

When a wafer is mounted on the mounting stage, and a high DC voltage is applied to the electrostatic electrode plate, a potential difference arises between the electrostatic electrode plate and a rear surface of the wafer, so that the wafer is attracted to the mounting stage through a Coulomb force or the like due to the potential difference. That is, the mounting stage acts as an electrostatic chuck.

The mounting stage is disposed on a substantially cylindrical susceptor. The susceptor has therein a coolant chamber and cools the wafer attracted to the mounting stage using a coolant in the coolant chamber during the plasma processing.

The thermally sprayed film on the mounting stage is ground using a grindstone obtained by compacting together abrasive grains and making into a disk shape. However, the surface (mounting surface) of the thermally sprayed film thus ground is still rough when viewed microscopically although it is smooth when viewed macroscopically.

If a number of wafers are subjected to the plasma processing on a wafer-by-wafer basis using the mounting stage having the ground mounting surface, each time a wafer is changed, the wafer and the mounting surface rub against each other, which causes the microscopic roughness of the mounting surface to change. That is, if a number of wafers are subjected to the plasma processing, the mounting surface becomes smooth when viewed microscopically. If the mounting surface becomes smooth, the contact area between a wafer and the mounting surface will increase, thus improving the efficiency of heat transfer from the wafer to the mounting surface, and by extension to the susceptor. As a result, the temperature of a wafer after a number of wafers are subjected to the plasma processing is lower than that of a wafer before a number of wafers are subjected to the plasma processing. Because the plasma processing is affected by the temperatures of wafers, processing results of the plasma processing carried out on a number of wafers cannot be maintained uniform.

Moreover, the present inventors ascertained that changes in the microscopic roughness of the mounting surface caused by the plasma processing saturate when the plasma processing has been carried out on a certain number of wafers (for example, the number of wafers corresponding to about an integrated time period of 3000 hours for which radio frequency electrical power is supplied in normal plasma processing).

To reduce such changes in the microscopic roughness of the mounting surface of the mounting stage, there has been developed a surface processing method for the mounting stage in which the mounting surface is subjected to grinding using a grindstone, lapping using a lapping plate, and lapping using a tape lapping apparatus in this order so that the mounting surface can be made smooth when viewed microscopically (see, for example, Japanese Laid-Open Patent Publication (Kokai) No. 2007-258240).

However, the above described surface processing method requires a number of processing apparatuses (the grindstone, the lapping plate, and the tape lapping apparatus) and a number of steps. For this reason, the above described surface processing method requires much time and effort and thus cannot be readily used. Moreover, the forms in which the grindstone, the lapping plate, and the tape lapping apparatus contact the mounting surface are different from the form in which a wafer contacts the mounting surface. Thus, the mounting surface of the mounting stage to which the above described surface processing method is applied is less likely to conform to wafers.

SUMMARY OF THE INVENTION

The present invention provides a surface processing method for a mounting stage, which enables a mounting surface conforming to a substrate to be formed while saving time and effort.

Accordingly, in the present invention, there is provided a surface processing method for a mounting stage that is disposed in a housing chamber of a substrate processing apparatus that carries out plasma processing on a substrate and has a mounting surface on which the substrate is mounted, comprising an expanding step of thermally expanding the mounted substrate.

According to the present invention, because the substrate mounted on the mounting surface of the mounting stage is thermally expanded, the contact surface of the substrate and the mounting surface rub against each other, so that the mounting surface becomes smooth when viewed microscopically. Because only the substrate is used, time and effort can be saved, and also, because the mounting surface is made smooth using the substrate itself, the mounting surface conforming to the substrate can be formed.

The present invention can provide a surface processing method for a mounting stage, wherein a thermal expansion coefficient of the substrate is different from a thermal expansion coefficient of the mounting stage.

According to the present invention, because the thermally expansion coefficient of the substrate is different from that of the mounting stage, the contact surface of the substrate and the mounting surface can strongly rub against each other when the substrate is thermally expanded.

The present invention can provide a surface processing method for a mounting stage, wherein the substrate processing apparatus comprises a gas introducing device that introduces a processing gas into the housing chamber, and an electrode that supplies radio frequency electrical power into the housing chamber, and in the expanding step, the processing gas is turned into plasma through the supplied radio frequency electrical power, and the substrate is heated by the plasma.

According to the present invention, because the plasma heats the substrate, the substrate can be easily heated. Moreover, because the gas introducing device and the electrode are essential components of the substrate processing apparatus using plasma, the necessity of providing any special device for expanding the substrate can be eliminated.

The present invention can provide a surface processing method for a mounting stage, wherein in the expanding step, a maximum amount of radio frequency electrical power that can be supplied by the electrode is supplied.

According to the present invention, because the maximum amount of radio frequency electrical power that can be supplied by the electrode is supplied when the substrate is thermally expanded, the amount of thermal expansion of the substrate can be increased, and hence the smoothing of the mounting surface can be further promoted.

The present invention can provide a surface processing method for a mounting stage, wherein the substrate processing apparatus comprises a gas supply device that supplies a heat transfer gas into a gap between the mounted substrate and the mounting surface, and in the expanding step, the gas supply device stops supplying the heat transfer gas.

According to the present invention, because the supply of the heat transfer gas into the gap between the substrate and the mounting surface is stopped when the substrate is to be thermally expanded, the efficiency of heat transfer from the substrate to the mounting stage lowers, so that the substrate can be easily heated to a high temperature. As a result, the smoothing of the mounting surface can be further promoted.

The present invention can provide a surface processing method for a mounting stage, wherein the mounting stage comprises an attracting device that electrostatically attracts the substrate, and in the expanding step, the attracting device electrostatically attracts the substrate.

According to the present invention, because the substrate is electrostatically attracted to the mounting stage when the substrate is to be thermally expanded, the substrate can strongly rub against the mounting surface, and hence the smoothing of the mounting surface can be reliably promoted.

The present invention can provide a surface processing method for a mounting stage, wherein the expanding step is repeatedly carried out.

According to the present invention, because the expanding step is repeatedly carried out, the number of times the substrate rubs against the mounting surface can be increased, and hence the mounting surface can be made smoother.

The present invention can provide a surface processing method for a mounting stage, wherein the mounted substrate is replaced each time the expanding step is repeated.

According to the present invention, the mounted substrate is replaced each time the expanding step is repeated. When the substrate is thermally expanded, the substrate separates and removes minute projections sunk in the substrate from the mounting surface. By changing substrates, the amount of minute projections to be removed can be increased, and hence the mounting surface can be reliably made smooth when viewed microscopically.

The present invention can provide a surface processing method for a mounting stage comprising a transferring step of transferring the mounted substrate out from the housing chamber after the expanding step, a removing step of removing deposit from a contact surface of the transferred substrate that contacts the mounting surface of the mounting stage, and a regrinding step of regrinding the contact surface of the substrate.

According to the present invention, deposit is removed from the contact surface of the substrate transferred out from the housing chamber, and the contact surface is reground. As a result, the substrate can be reused.

The present invention can provide a surface processing method for a mounting stage, wherein the substrate has a film that covers a contact surface, and a hardness of the film is lower than a hardness of the mounting surface.

According to the present invention, because the hardness of the film that covers the contact surface is lower than that of the mounting surface, minute projections on the mounting surface can be reliably made to sink into the film and removed, and hence the mounting surface can be more reliably made smooth.

The features and advantages of the invention will become more apparent from the following detailed description taken in conjunction with the accompanying drawings.

DETAILED DESCRIPTION OF THE PREFERRED EMBODIMENTS

The present invention will now be described in detail with reference to the drawings showing a preferred embodiment thereof.

First, a description will be given of a substrate processing apparatus to which a surface processing method for a mounting stage according to an embodiment of the present invention is applied.

Figure 1:
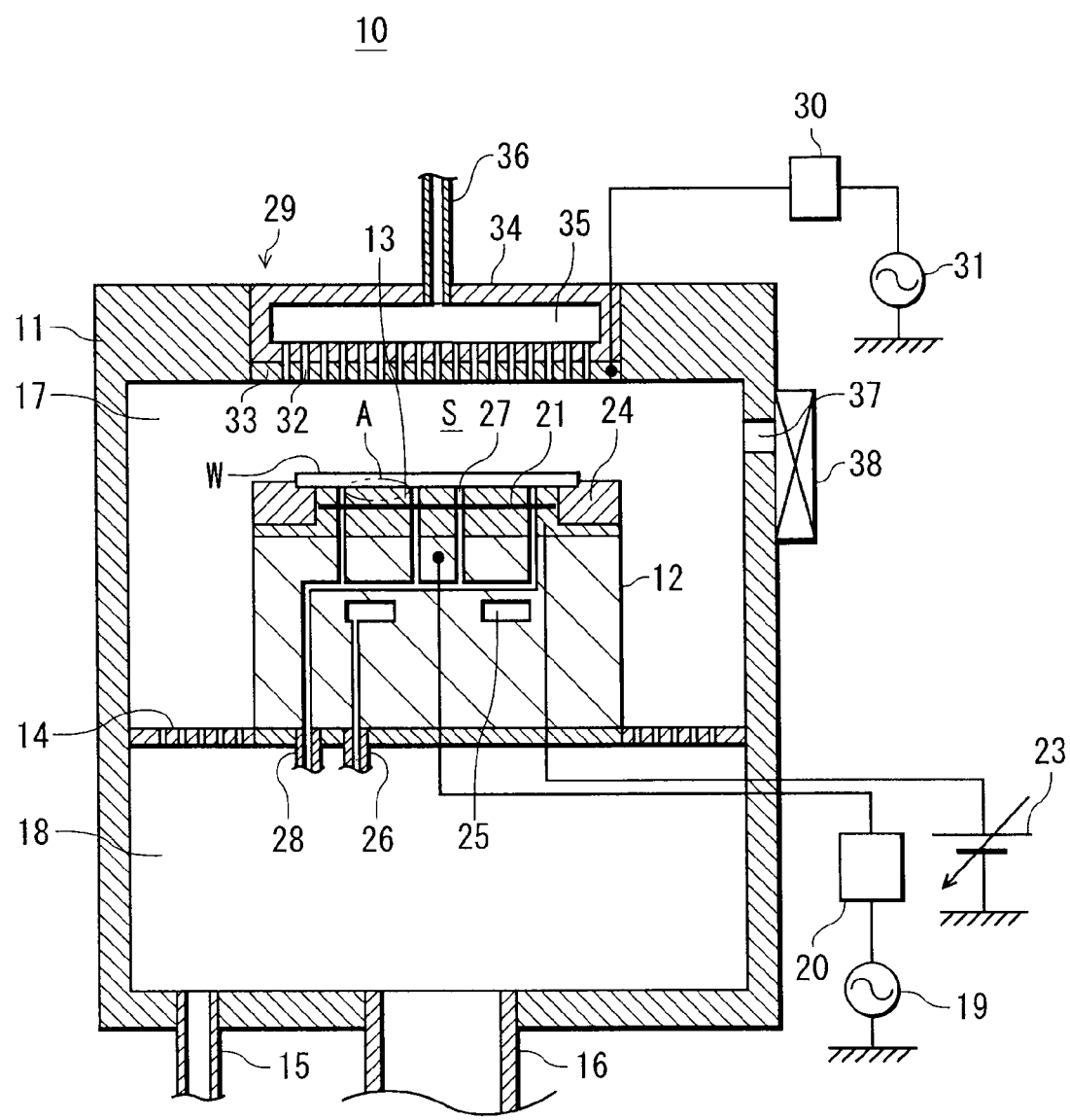
FIG. 1 is a sectional view schematically showing the construction of a substrate processing apparatus to which a surface processing method for a mounting stage according to an embodiment of the present invention is applied.

FIG. 1 is a sectional view schematically showing the construction of the substrate processing apparatus to which the surface processing method for the mounting stage according to the present embodiment is applied. The substrate processing apparatus is constructed such as to carry out etching processing on a semiconductor wafer as a substrate.

As shown in FIG. 1, the substrate processing apparatus 10 has a chamber 11 (housing chamber) in which is housed a semiconductor wafer (hereinafter referred to merely as a "wafer") W having a diameter of, for example, 300 mm, and a cylindrical susceptor 12 is disposed in the chamber 11. An ESC (electrostatic chuck) 13 (mounting stage) is disposed on the susceptor 12. The ESC 13 is formed by laying an upper disk-shaped member having a given diameter over a lower disk-shaped member having a larger diameter than the diameter of the upper disk-shaped member. The ESC 13 is made of aluminum, and a thermally sprayed film (not shown) is formed on an upper surface of the upper disk-shaped member by thermally spraying with a ceramic or the like such as alumina. An electrostatic electrode plate 21 (attracting device) to which a DC voltage is to be applied is disposed inside the thermally sprayed film. The wafer W housed in the chamber 11 is mounted on an upper surface of the upper disk-shaped member of the ESC 13, that is, an upper surface of the thermally sprayed film (hereinafter referred to as the "mounting surface").

A lower radio frequency power source 19 is connected to the susceptor 12 via a lower matcher 20. The lower radio frequency power source 19 applies predetermined radio frequency electrical power to the susceptor 12. The susceptor 12 thus acts as a lower electrode (electrode) that supplies radio frequency electrical power into a processing space S, described later. The lower matcher 20 reduces reflection of the radio frequency electrical power from the susceptor 12 so as to maximize the efficiency of the supply of the radio frequency electrical power into the susceptor 12.

A DC power source 23 is electrically connected to the electrostatic electrode plate 21 of the ESC 13. Upon a positive high DC voltage being applied to the electrostatic electrode plate 21, a negative potential is produced on a surface (hereinafter referred to merely as the "contact surface") of the wafer W which contacts the mounting surface. A potential difference thus arises between the electrostatic electrode plate 21 and the contact surface of the wafer W, and hence the wafer W is attracted to and held on the mounting surface of the ESC 13 through a Coulomb force or a Johnsen-Rahbek force due to the potential difference.

In the substrate processing apparatus 10, a flow path through which gas above the susceptor 12 is exhausted out of the chamber 11 is formed between an inner wall surface of the chamber 11 and the side face of the susceptor 12. An exhaust plate 14 is disposed part way along the flow path.

The exhaust plate 14 is a plate-shaped member having a large number of holes therein, and acts as a partitioning plate that partitions the chamber 11 into an upper portion and a lower portion. Plasma, described below, is produced in the upper portion (hereinafter referred to as the "reaction chamber") 17 of the chamber 11 partitioned by the exhaust plate 14. Moreover, a roughing exhaust pipe 15 and a main exhaust pipe 16 that exhaust gas out from the chamber 11 are opened to the lower portion (hereinafter referred to as the "manifold") 18 of the chamber 11. The roughing exhaust pipe 15 has a DP (dry pump) (not shown) connected thereto, and the main exhaust pipe 16 has a TMP (turbo-molecular pump) (not shown) connected thereto. Moreover, the exhaust plate 14 prevents leakage of plasma produced in the processing space S in the reaction chamber 17 into the manifold 18.

Moreover, an annular focus ring 24 is provided on the ESC 13. The focus ring 24 is made of a conductive member such as silicon and surrounds the wafer W attracted to and held on the mounting surface of the ESC 13. The focus ring 24 focuses plasma in the processing space S toward a front surface of the wafer W, thus improving the efficiency of the etching processing.

An annular coolant chamber 25 that extends, for example, in a circumferential direction of the susceptor 12 is provided inside the susceptor 12. A coolant, for example, cooling water or a GALDEN (registered trademark) fluid, at a low temperature is circulated through the coolant chamber 25 via coolant piping 26 from a chiller unit (not shown). The susceptor 12 cooled by the low-temperature coolant cools the wafer W via the ESC 13.

A plurality of heat transfer gas supply holes 27 (gas supply devices) are provided in the mounting surface of the ESC 13. The heat transfer gas supply holes 27 are connected to a heat transfer gas supply unit (gas supply device) (not shown) by a heat transfer gas supply line 28. The heat transfer gas supply unit supplies helium (He) gas as a heat transfer gas via the heat transfer gas supply holes 27 into a gap between the wafer W and the mounting surface. The helium gas supplied into the gap between the wafer W and the mounting surface effectively transfers heat of the wafer W to the ESC 13.

A gas introducing shower head 29 (gas introducing device) is disposed in a ceiling portion of the chamber 11 such as to face the susceptor 12. An upper radio frequency power source 31 is connected to the gas introducing shower head 29 via an upper matcher 30. The upper radio frequency power source 31 supplies predetermined radio frequency electrical power to the gas introducing shower head 29, and the gas introducing shower head 29 supplies the radio frequency electrical power to the processing space S. The gas introducing shower head 29 thus acts as an upper electrode. The upper matcher 30 has a similar function to the lower matcher 20, described earlier.

The gas introducing shower head 29 has a ceiling electrode plate 33 having a large number of gas holes 32 therein, and an electrode support 34 on which the ceiling electrode plate 33 is detachably supported. A buffer chamber 35 is provided inside the electrode support 34. A processing gas introducing pipe 36 is connected to the buffer chamber 35. A processing gas supplied from the processing gas introducing pipe 36 into the buffer chamber 35 is supplied by the gas introducing shower head 29 into the reaction chamber 17 via the gas holes 32.

A transfer port 37 for use in transferring the wafers W into and from the reaction chamber 17 is provided in a side wall of the chamber 11, and a gate valve 38 for opening and closing the transfer port 37 is provided in the transfer port 37.

In the reaction chamber 17 of the substrate processing apparatus 10, radio frequency electrical power is supplied to the processing space S between the ESC 13 and the gas introducing shower head 29, whereby a processing gas supplied into the processing space S from the gas introducing shower head 29 is turned into plasma. The wafer W is subjected to the etching processing by the plasma.

Operation of the component elements of the substrate processing apparatus 10 described above is controlled in accordance with a program for the etching processing by a CPU of a control unit (not shown) of the substrate processing apparatus 10.

Next, a description will be given of how the mounting surface of the ESC 13 is made smooth using a wafer W.

FIGS. 2A to 2E are process drawings useful in explaining how the mounting surface of the ESC is made smooth using a wafer. FIGS. 2A to 2E are enlarged views of a portion A shown in FIG. 1.

Figure 2A:
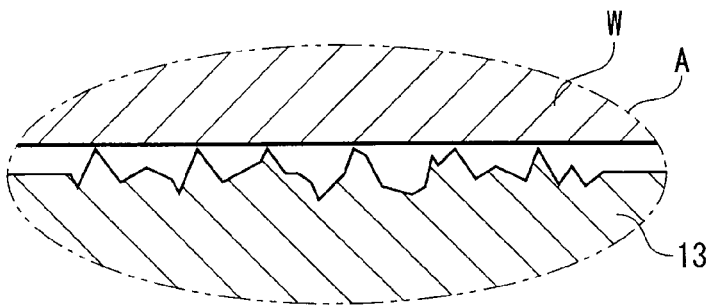
FIGS. 2A to 2E are process drawings useful in explaining how a mounting surface of an electrostatic chuck is made smooth using a wafer.

As shown in FIG. 2A, when viewed microscopically, there are projections and depressions on the mounting surface that has been ground using a grindstone. When a wafer W is mounted on the mounting surface, the wafer W is supported by minute projections on the mounting surface.

Figure 2B:
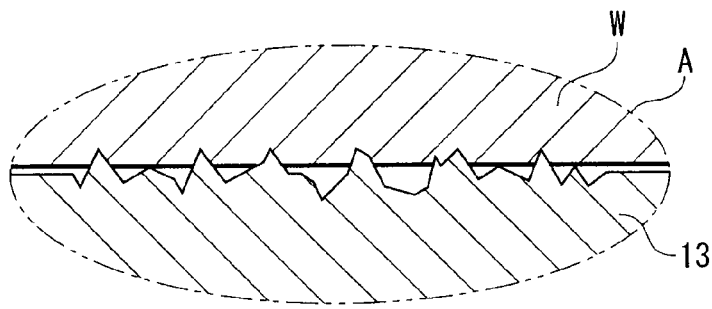

Then, a high DC voltage is applied to the electrostatic electrode plate 21, so that the wafer W is electrostatically attracted to the mounting surface. At this time, the wafer W is strongly pressed against the mounting surface through a Coulomb force or the like. Because the hardness of a ceramic constituting the thermally sprayed film having the mounting surface is higher than that of silicon constituting the wafer W, the minute projections on the mounting surface sink into a rear surface (hereinafter referred to as the "contact surface") of the wafer W (FIG. 2B).

Figure 2C:
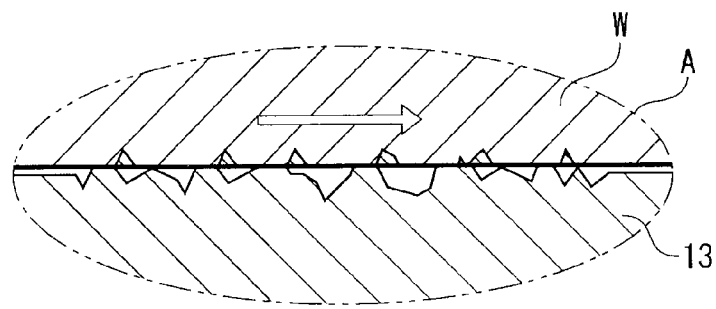

The thermal expansion coefficient of silicon and the thermal expansion coefficient of a ceramic are different, and hence the thermal expansion coefficient of the wafer W and the thermal expansion coefficient of the mounting surface are different. Here, when the wafer W mounted on the mounting surface is heated, the wafer W is thermally expanded. At this time, the amount of thermal expansion of the wafer W and the amount of thermal expansion of the mounting surface are different, and hence the contact surface of the wafer W and the mounting surface rub against each other by a large amount (rub in the direction indicated by the outline arrow in FIG. 2C). When the contact surface of the wafer W and the mounting surface are rubbing against each other, the contact surface is shifted with the minute projections on the mounting surface being sunk in the contact surface (FIG. 2C). That is, the minute projections on the mounting surface are separated from the mounting surface.

Figure 2D:
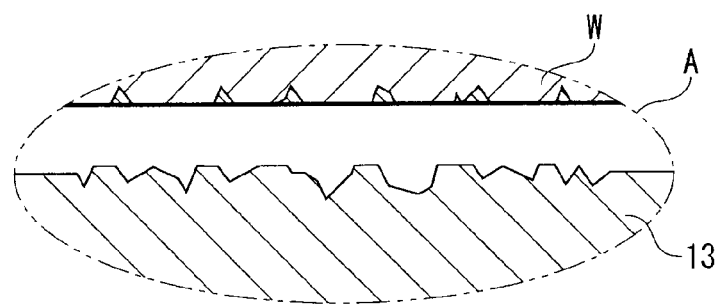
Figure 2E:
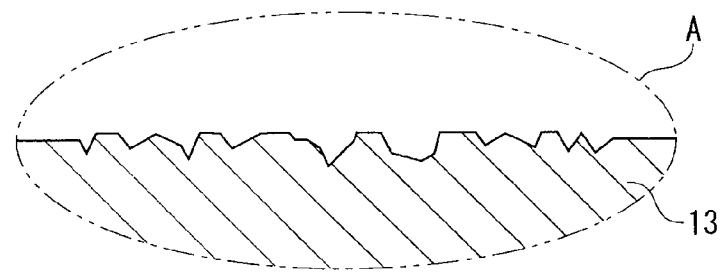

Then, when the wafer W is to be removed from the mounting surface, the wafer W is separated from the mounting surface with the minute projections on the mounting surface being sunk in the contact surface (FIG. 2D). As a result, the minute projections are removed from the mounting surface, so that the mounting surface becomes smooth when viewed microscopically (FIG. 2E).

In the surface processing method for the mounting stage according to the present embodiment, the above described smoothing of the mounting surface using a wafer W is used. A description will now be given of mounting surface processing as the surface processing method for the mounting stage according to the present embodiment.

Figure 3:
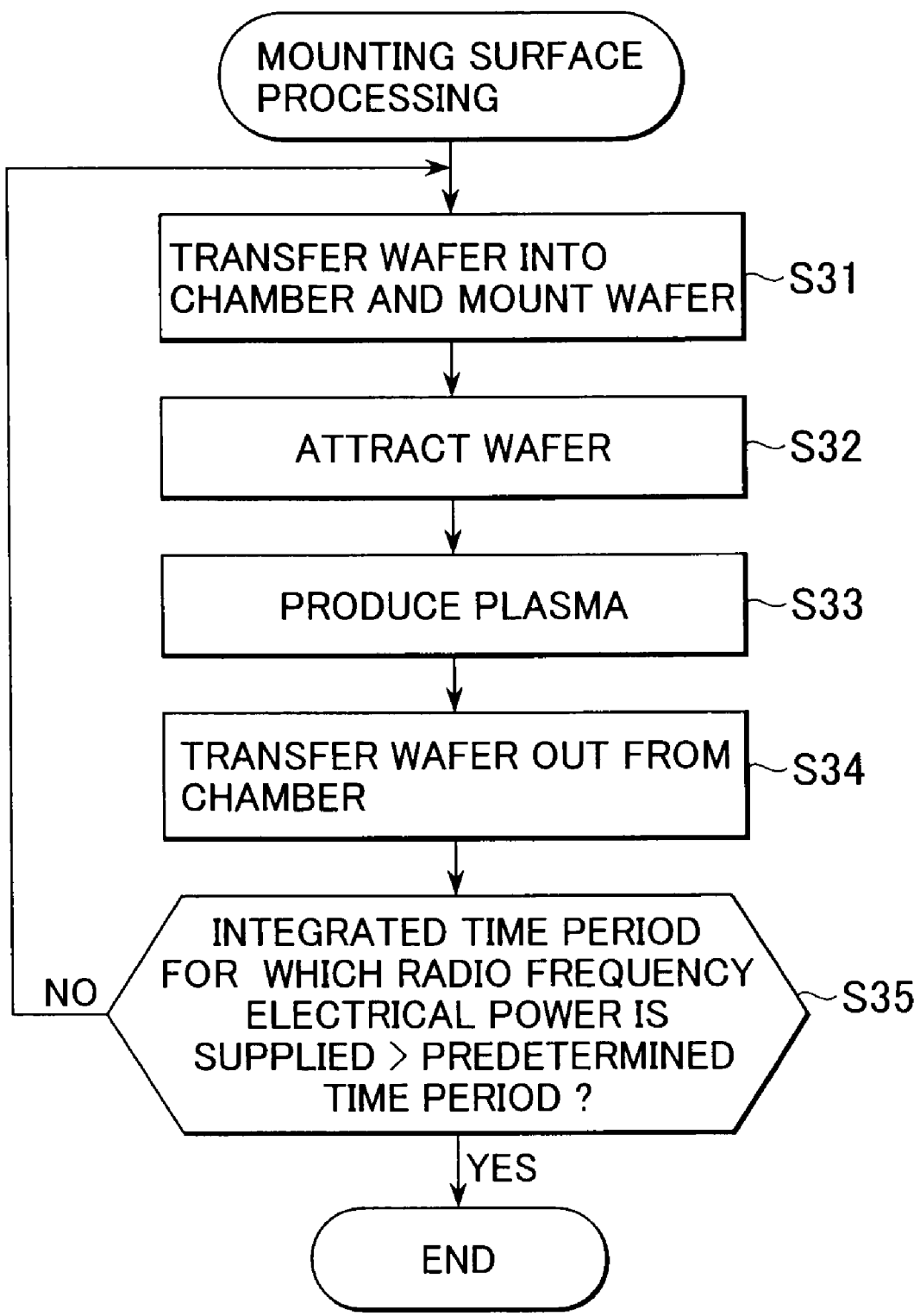
FIG. 3 is a flow chart of mounting surface processing as the surface processing method for the mounting stage according to the present embodiment.

FIG. 3 is a flow chart of the mounting surface processing as the surface processing method for the mounting stage according to the present embodiment.

As shown in FIG. 3, first, a wafer W is transferred into the chamber 11 and mounted on the mounting surface of the ESC 13 (step S31). Then, a high DC voltage is applied to the electrostatic electrode plate 21, so that the wafer W is electrostatically attracted to the mounting surface (step S32). A Coulomb force of, for example, 100 kgf acts on the wafer W, and at this time, minute projections on the mounting surface sink into the contact surface of the wafer W as described above. It should be noted that the wafer W is kept electrostatically attracted to the mounting surface until a step S33, described later.

Then, the gas introducing shower head 29 supplies a processing gas into the reaction chamber 17, and further, the gas introducing shower head 29 and the susceptor 12 supply radio frequency electrical power into the processing space S. At this time, the processing gas is turned into plasma in the processing space S (step S33) (expanding step). The plasma lies in a high-energy state, and the wafer W is mounted on the ESC 13 such as to face the processing space S. The plasma thus transfers thermal energy to the wafer W and heats the wafer W. As a result, the wafer W is thermally expanded. At this time, as described above, the contact surface and the mounting surface rub against each other, and the contact surface is shifted with the minute projections on the mounting surface being sunk in the contact surface.

In the step S33, so that the contact surface and the mounting surface can rub against each other by a large amount, the thermal expansion coefficient of the wafer W has to be as high as possible. Accordingly, in the step S33, the gas introducing shower head 29 and the susceptor 12 supply the maximum amount of radio frequency electrical power that can be supplied (for example, the gas introducing shower head 29 supplies radio frequency electrical power of 3300 W, and the susceptor 12 supplies radio frequency electrical power of 3800 W), and the heat transfer gas supply unit stops supplying the helium gas into the gap between the contact surface and the mounting surface. Therefore, the energy of the plasma can be increased, and hence the plasma can transfer a large amount of thermal energy to the wafer W, thus lowering the efficiency of heat transfer from the wafer W to the ESC 13. As a result, the wafer W can be easily heated to a high temperature, and the amount of thermal expansion of the wafer W can be increased, thus promoting the smoothing of the mounting surface.

Next, the supply of the radio frequency electrical power into the processing space S is stopped to cause the plasma to disappear, the remaining processing gas is exhausted out of the chamber 11, and then the wafer W is transferred out from the chamber 11 (step S34). At this time, because the minute projections on the mounting surface are still sunk in the wafer W, the minute projections on the mounting surface are removed from the mounting surface. As a result, the mounting surface becomes smooth when viewed microscopically.

As described above, when the wafer W is transferred into or out from chamber 11, that is, when the wafer W is replaced, the minute projections on the mounting surface are removed from the mounting surface, and by repeating the replacement of the wafer W, the mounting surface is made smoother when viewed microscopically. Moreover, in the substrate processing apparatus 10, the plasma heats the wafer W each time the wafer W is replaced, and hence the smoothness of the mounting surface is proportional to the time period for which the plasma is produced, and by extension the integrated time period for which the radio frequency electrical power is supplied into the processing space S. Thus, in the next step S35, it is determined whether or not the integrated time period for which the radio frequency electrical power is supplied has exceeded a predetermined time period. Here, an integrated value of radio frequency electrical power supply time period that can achieve a target smoothness is obtained in advance through experiments or the like and set as the predetermined time period.

If, as a result of the determination in the step S35, the integrated time period for which the radio frequency electrical power is supplied has exceeded the predetermined time period (YES to the step S35), the process is brought to an end. On the other hand, if the integrated time period for which the radio frequency electrical power is supplied has not exceeded the predetermined time period (NO to the step S35), the process returns to the step S31. That is, if the integrated time period for which the radio frequency electrical power is supplied has not exceeded the predetermined time period, the thermal expansion of the wafer W mounted on the mounting surface is repeatedly carried out. Moreover, because the wafer W is always transferred into and out from the chamber 11 before and after the thermal expansion of the wafer W, the wafer W mounted on the mounting surface is replaced each time the thermal expansion of the wafer W is repeated.

According to the process of FIG. 3, because the wafer W mounted on the mounting surface of the ESC 13 is thermally expanded, the contact surface of the wafer W and the mounting surface rub against each other, so that the mounting surface is made smooth when viewed microscopically. Because only the wafer W is used at this time, time and effort can be saved, and also, because the mounting surface is made smooth using the wafer W itself, the mounting surface conforming to the wafer W can be formed.

In the process of FIG. 3 described above, because the wafer W is heated by the plasma produced using the gas introducing shower head 29 and the susceptor 12, the wafer W can be easily heated. Moreover, because the gas introducing shower head 29 and the susceptor 12 are essential components of the substrate processing apparatus 10, the necessity of providing any special device for thermally expanding the wafer W can be eliminated.

Moreover, in the process of FIG. 3 described above, because the wafer W is electrostatically attracted to the ESC 13 when the wafer W is to be thermally expanded, the wafer W can strongly rub against the mounting surface. Thus, not only the minute projections on the mounting surface are removed, but also the minute projections are crushed, and hence the smoothing of the mounting surface can be reliably promoted.

Further, in the process of FIG. 3 described above, because the thermal expansion of the wafer W is repeatedly carried out, the number of times the wafer W rubs against the mounting surface can be increased, and hence the mounting surface can be made smoother.

Further, in the process of FIG. 3 described above, the wafer W mounted on the mounting surface is replaced each time the thermal expansion of the wafer W is repeated. The amount of minute projections removed can be increased through the replacement of the wafer W, and hence the mounting surface can be reliably made smooth when viewed microscopically.

Figure 4A:
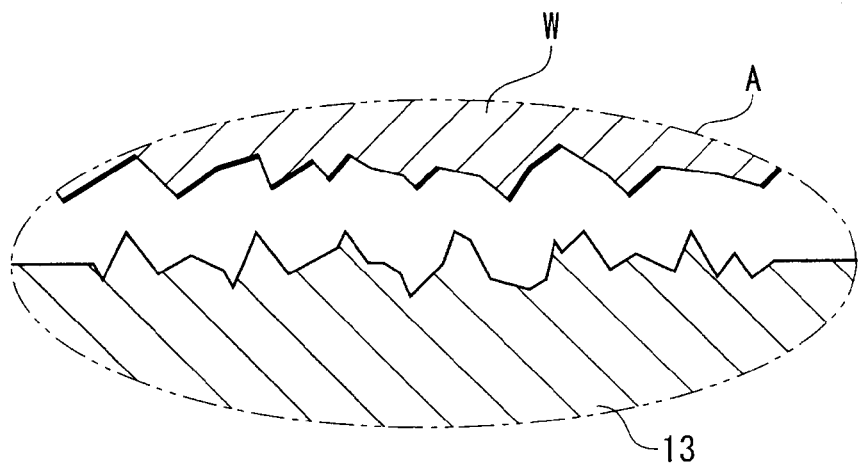
FIGS. 4A and 4B are process drawings useful in explaining a case where a substrate having a rough contact surface is mounted on the mounting surface.
Figure 4B:
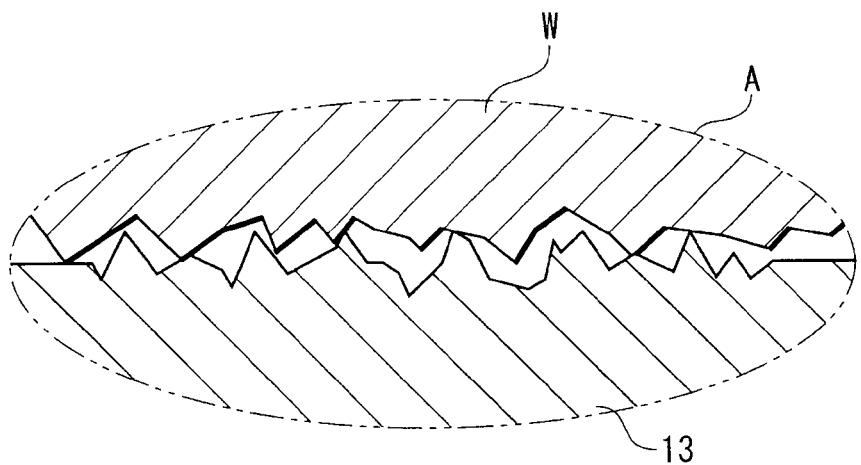

In the surface processing method for the mounting stage according to the present embodiment described above, because minute projections on the mounting surface are made to sink into the contact surface of the wafer W so as to remove the minute projections from the mounting surface, the state of the contact surface is important. For example, if the contact surface of the wafer W is rough as shown in FIG. 4A, even if the wafer W is electrostatically attracted to the mounting surface, there are a number of depressions on the contact surface, and hence minute projections on the mounting surface are housed in the depressions. As a result, the minute projections on the mounting surface cannot sink into the contact surface of the wafer W by a large amount (FIG. 4B).

In the present embodiment, it is thus preferred that the contact surface of the wafer W is not rough but is a surface on which chemical grinding and mechanical grinding have been carried out. In this case, the depressions can be removed from the contact surface, so that the minute projections on the mounting surface can be reliably made to sink into the contact surface and removed, and hence the mounting surface can be more reliably made smooth.

Moreover, in the present embodiment, instead of carrying out chemical grinding and mechanical grinding on the contact surface of the wafer W, a film having a lower hardness than the hardness of a ceramic may be provided on the contact surface of the wafer W. In this case as well, minute projections on the mounting surface can be reliably made to sink into the contact surface and removed, and hence the mounting surface can be more reliably made smooth.

In the surface processing method for the mounting stage according to the present embodiment described above, because the mounting surface is made smooth when viewed microscopically while replacing wafers W, a number of wafers W are required. In recent years, however, the prices of wafers W have risen due to an increase in the diameter of wafers W and the like. It is thus necessary to minimize the number of wafers W used in the surface processing method for the mounting stage. On the other hand, because the contact surface of a wafer W mounted on the mounting surface and thermally expanded rubs against the mounting surface, there may be a case where the contact surface of the wafer W transferred out from the chamber 11 is rough, and the wafer W used in the process of FIG. 3 cannot be immediately reused.

To cope with this, the contact surface of the wafer W used in the process of FIG. 3 may be reground. Specifically, after the thermally-expanded wafer W is transferred out from the chamber 11 (step S34), the contact surface of the wafer W may be reground by subjecting it to chemical grinding and mechanical grinding. Thus, the wafer W whose contact surface has been made rough as a result of the process of FIG. 3 can be reused.

Here, there may be cases where CF type deposit produced during the etching processing is attached to the ESC 13, and the deposit is transferred from the ESC 13 onto the contact surface of the wafer W and becomes attached to the contact surface of the wafer W. If the deposit is attached to the contact surface, the contact surface cannot come close to the mounting surface, and as a result, minute projections on the mounting surface cannot be made to sink into the contact surface of the wafer W. It is thus preferred that after the wafer W is transferred out from the chamber 11, the deposit is removed from the contact surface of the wafer W prior to the regrinding of the wafer W. The deposit is removed through, for example, wet etching using a chemical solution, atmospheric etching using remote plasma, or mechanical scraping.

It should be noted that in ordinary cases, a wafer W whose contact surface has been reground is not immediately used but housed in a housing box or the like and used to carry out other mounting surface processing. However, in a case where deposit removal and regrinding can be completed quickly, the wafer W may be used for mounting surface processing currently being carried out.

Although in the surface processing method for the mounting stage according to the present embodiment described above, semiconductor wafers are used as the substrates, this is not limitative, but the type of the substrates may be varied according to the type of the substrate on which the plasma processing is carried out by the substrate processing apparatus 10. For example, glass substrates used in LCDs (Liquid Crystal Displays), FPDs (Flat Panel Displays), or the like may be used.

Next, an example of the present invention will be concretely described.

First, to set the target temperature of a wafer W, the wafer W was subjected to etching processing using the substrate processing apparatus 10 having the ESC 10 to which radio frequency electrical power had been supplied for a total of 2950 hours as an integrated time period for which the radio frequency electrical power is supplied in normal etching processing, and the temperature of the wafer W in the etching processing was measured. The measured temperature was about 45° C. at 100 mm from the center of the wafer W. Thus, the target temperature was set to 45° C.

EXAMPLE 25 wafers W were prepared, and the process of FIG. 3 was carried out using these wafers W. At this time, radio frequency electrical power supplied by the gas introducing shower head 29 and the susceptor 12 in the step S33 was set to 3300 W and 3800 W, respectively. Also, the predetermined time period in the step S35 was set to 20 hours. It should be noted that the time period for which radio frequency electrical power is supplied was set to 60 seconds per wafer W, and hence in the present example, the replacement of the wafer W was carried out 1200 times.

After that, a wafer W was subjected to etching processing using the substrate processing apparatus 10 having the ESC 13 whose mounting surface had been made smooth when viewed microscopically through the process of FIG. 3, and the temperature of the wafer W in the etching processing was measured. The measured temperature was about 43° C. to 47° C. at 100 mm from the center of the wafer W, and the average temperature was about 45° C.

Comparative Example

The substrate processing apparatus 10 having the ESC 13 whose mounting surface has been merely ground using a grindstone was prepared, a wafer W was subjected to etching processing using the substrate processing apparatus 10, and the temperature of the wafer W in the etching processing was measured. The measured temperature was about 52° C. to 55.5° C. at 100 mm from the center of the wafer W, and the average temperature was about 54° C.

As a result of comparison between the example and the comparative example, it was found that, because the temperature in the example is close to the target temperature, and higher heat transfer performance can be achieved in the example than in the comparative example, the mounting surface of the ESC 13 subjected to the process of FIG. 3 is made smooth when viewed microscopically just like the mounting surface of the ESC 13 to which radio frequency electrical power has been supplied for a total of 2950 hours as an integrated time period for which the radio frequency electrical power is supplied in normal etching processing.

What is claimed is:

1. A surface processing method for a mounting stage that is disposed in a housing chamber of a substrate processing apparatus that carries out plasma processing on a substrate and has a mounting surface on which the substrate is mounted, comprising:
   an expanding step of thermally expanding the mounted substrate, wherein
   the substrate processing apparatus comprises a gas introducing device that introduces a processing gas into the housing chamber and acts as an upper electrode by supplying radio frequency electrical power into a processing space in the housing chamber and a susceptor that acts as a lower electrode by supplying radio frequency electrical power into the processing space in the housing chamber,
   said expanding step is repeatedly carried out on the same mounting stage, and
   in the expanding step, at least 3300 W of radio frequency electrical power is supplied from the gas introducing device and at least 3800 W of radio frequency electrical power is supplied from the susceptor into the processing space in the housing chamber.

2. A surface processing method for a mounting stage according to claim 1, wherein a thermal expansion coefficient of the substrate is different from a thermal expansion coefficient of the mounting stage.

3. A surface processing method for a mounting stage according to claim 1, wherein,
   in said expanding step, the processing gas is turned into plasma through the supplied radio frequency electrical power, and the substrate is heated by the plasma.

4. A surface processing method for a mounting stage according to claim 1, wherein,
   the substrate processing apparatus comprises a gas supply device that supplies a heat transfer gas into a gap between the mounted substrate and the mounting surface, and
   in said expanding step, the gas supply device stops supplying the heat transfer gas.

5. A surface processing method for a mounting stage according to claim 1, wherein,
   the mounting stage comprises an attracting device that electrostatically attracts the substrate, and
   in said expanding step, the attracting device electrostatically attracts the substrate.

6. A surface processing method for a mounting stage according to claim 1, wherein the mounted substrate is replaced each time said expanding step is repeated.

7. A surface processing method for a mounting stage according to claim 1, wherein,
   the substrate has a film that covers a contact surface, and
   a hardness of the film is lower than a hardness of the mounting surface.

8. A surface processing method for a mounting stage that is disposed in a housing chamber of a substrate processing apparatus that carries out plasma processing on a substrate and has a mounting surface on which the substrate is mounted, comprising:
   an expanding step of thermally expanding the mounted substrate;
   a transferring step of transferring the mounted substrate out from the housing chamber after said expanding step;
   a removing step of removing deposit from a contact surface of the transferred substrate that contacts the mounting surface of the mounting stage; and
   a regrinding step of regrinding the contact surface of the substrate, wherein
   the expanding step is repeatedly carried out on the same mounting stage.

* * * * *